(12) United States Patent
Cheng et al.

(10) Patent No.: US 10,043,663 B2
(45) Date of Patent: *Aug. 7, 2018

(54) ENHANCED DEFECT REDUCTION FOR HETEROEPITAXY BY SEED SHAPE ENGINEERING

(71) Applicant: INTERNATIONAL BUSINESS MACHINES CORPORATION, Armonk, NY (US)

(72) Inventors: Cheng-Wei Cheng, White Plains, NY (US); David L. Rath, Stormville, NY (US); Devendra K. Sadana, Pleasantville, NY (US); Kuen-Ting Shiu, Yorktown Heights, NY (US); Brent A. Wacaser, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/395,805

(22) Filed: Dec. 30, 2016

(65) Prior Publication Data

US 2017/0140919 A1    May 18, 2017

Related U.S. Application Data

(63) Continuation of application No. 14/944,770, filed on Nov. 18, 2015, now Pat. No. 9,564,494.

(51) Int. Cl.
*H01L 29/00* (2006.01)
*H01L 21/02* (2006.01)
(Continued)

(52) U.S. Cl.
CPC ........ *H01L 21/0243* (2013.01); *C30B 23/025* (2013.01); *C30B 23/04* (2013.01);
(Continued)

(58) Field of Classification Search
CPC ......... H01L 21/02433; H01L 21/02609; H01L 29/04; H01L 21/02636; H01L 29/045
See application file for complete search history.

(56) References Cited

U.S. PATENT DOCUMENTS 8,119,494 B1    2/2012   Vellianitis
8,253,211 B2 *  8/2012   Cheng ............... H01L 21/02532
                                                  257/431

(Continued)

OTHER PUBLICATIONS

Junesand, C. et al., "Heteroepitaxial Growth of Indium Phosphide from Nano-openings Made by Masking on a Si (001) Wafer" 2010 International Conference on Indium Phosphide & Related Materials (IPRM) (May 31, 2010-Jun. 4, 2010) pp. 1-4.

(Continued)

*Primary Examiner* — Ngan Ngo
(74) *Attorney, Agent, or Firm* — Tutunjian & Bitetto, P.C.; Louis J. Percello (57) ABSTRACT

A heteroepitaxially grown structure includes a substrate and a mask including a high aspect ratio trench formed on the substrate. A cavity is formed in the substrate having a shape with one or more surfaces and including a resistive neck region at an opening to the trench. A heteroepitaxially grown material is formed on the substrate and includes a first region in or near the cavity and a second region outside the first region wherein the second region contains fewer defects than the first region.

20 Claims, 6 Drawing Sheets

(51) Int. Cl.

| | | |
|---|---|---|
| *C30B 23/02* | (2006.01) | |
| *C30B 25/18* | (2006.01) | |
| *C30B 25/04* | (2006.01) | |
| *C30B 23/04* | (2006.01) | |
| *C30B 29/40* | (2006.01) | |
| *C30B 29/52* | (2006.01) | |
| *H01L 29/66* | (2006.01) | |
| *H01L 29/04* | (2006.01) | |

(52) U.S. Cl.
CPC ............ *C30B 25/04* (2013.01); *C30B 25/183* (2013.01); *C30B 25/186* (2013.01); *C30B 29/40* (2013.01); *C30B 29/52* (2013.01); *H01L 21/02378* (2013.01); *H01L 21/02381* (2013.01); *H01L 21/02389* (2013.01); *H01L 21/02392* (2013.01); *H01L 21/02395* (2013.01); *H01L 21/02422* (2013.01); *H01L 21/02425* (2013.01); *H01L 21/02433* (2013.01); *H01L 21/02461* (2013.01); *H01L 21/02499* (2013.01); *H01L 21/02532* (2013.01); *H01L 21/02543* (2013.01); *H01L 21/02546* (2013.01); *H01L 21/02609* (2013.01); *H01L 21/02636* (2013.01); *H01L 21/02639* (2013.01); *H01L 29/04* (2013.01); *H01L 29/045* (2013.01); *H01L 29/66795* (2013.01)

(56) References Cited

U.S. PATENT DOCUMENTS

| | | | |
|---|---|---|---|
| 8,603,898 B2 | 12/2013 | Bao et al. | |
| 8,659,091 B2 | 2/2014 | Cai et al. | |
| 8,796,758 B2 | 8/2014 | Lin et al. | |
| 8,822,248 B2 | 9/2014 | Park | |
| 8,847,279 B2 | 9/2014 | Bai et al. | |
| 9,564,494 B1* | 2/2017 | Cheng | H01L 29/32 |
| 2002/0022287 A1* | 2/2002 | Linthicum | H01L 21/0237 |
| | | | 438/46 |
| 2006/0292719 A1* | 12/2006 | Lochtefeld | H01L 21/02381 |
| | | | 438/22 |
| 2008/0006201 A1* | 1/2008 | Hirota | C30B 23/025 |
| | | | 117/90 |
| 2008/0099785 A1* | 5/2008 | Bai | C30B 25/183 |
| | | | 257/190 |
| 2008/0308841 A1* | 12/2008 | Odnoblyudov | H01L 21/0242 |
| | | | 257/190 |
| 2010/0065854 A1* | 3/2010 | Kamber | C30B 25/183 |
| | | | 257/76 |
| 2010/0323506 A1* | 12/2010 | Cheng | H01L 21/0242 |
| | | | 438/507 |
| 2011/0298089 A1* | 12/2011 | Krishnan | H01L 29/945 |
| | | | 257/532 |
| 2012/0175675 A1* | 7/2012 | Luo | H01L 21/02381 |
| | | | 257/183 |
| 2013/0037857 A1* | 2/2013 | Von Kanel | H01L 21/0237 |
| | | | 257/190 |
| 2013/0207161 A1* | 8/2013 | Wang | H01L 21/02381 |
| | | | 257/190 |
| 2013/0228797 A1* | 9/2013 | Nagasawa | H01L 21/02381 |
| | | | 257/77 |
| 2013/0320355 A1* | 12/2013 | Xie | C30B 25/186 |
| | | | 257/76 |
| 2014/0103394 A1 | 4/2014 | Cheng | |
| 2014/0329376 A1* | 11/2014 | Sanchez | H01L 21/02381 |
| | | | 438/492 |

OTHER PUBLICATIONS

List of IBM Patents or Patent Applications Treated as Related dated Dec. 29, 2016, 2 pages.

* cited by examiner

ENHANCED DEFECT REDUCTION FOR HETEROEPITAXY BY SEED SHAPE ENGINEERING

BACKGROUND

Technical Field

The present invention relates to heteroepitaxy, and more particularly to devices and methods for employing crystal defect cancellation structures for epitaxially forming a crystal on non-lattice matched materials.

Description of the Related Art

High aspect ratio features with patterns and materials engineered so that selective area growth only occurs at a bottom of the features may help reduce defects during heteroepitaxy. This permits defects to terminate along sidewalls of the features. This type of defect reduction is called aspect ratio trapping (ART). Work has been done on controlling a seed area at the bottom of the high aspect ratio features at the bottom interfaces (e.g., making a V groove) to help control which defects and interfaces are active at relieving the strain and to trap the defects.

However, the trapping schemes and features attempted guide the fronts along only one or two growth fronts. This fails to address that in many crystal systems there are actually more crystallographic directions that are active for stacking faults and other defect generations.

SUMMARY

A heteroepitaxially grown structure includes a substrate and a mask including a high aspect ratio trench formed on the substrate. A cavity is formed in the substrate having a shape with one or more surfaces and including a resistive neck region at an opening to the trench. A heteroepitaxially grown material is formed on the substrate and includes a first region in or near the cavity and a second region outside the first region wherein the second region contains fewer defects than the first region.

Another heteroepitaxially grown structure includes a crystalline semiconductor substrate including a first material and a dielectric layer including a high aspect ratio trench formed on the substrate. A cavity is formed in the substrate having a shape with one or more surfaces and including a resistive neck region at an opening to the trench. A heteroepitaxially grown material is formed on the substrate and includes a first region in or near the cavity and a second region outside the first region wherein the first region contains defects and the second region includes fewer defects than the first region. An electronic device is formed in the first region of the heteroepitaxially grown material.

A method for heteroepitaxially growing a material include forming a mask layer on a substrate; etching a high aspect ratio trench in the mask layer; etching a cavity in the substrate through the trench to form a shape with one or more surfaces to direct defect into one another on multiple growth fronts and including a resistive neck region at an opening to the trench; and heteroepitaxially growing a crystal material on the substrate where a first region in or near the cavity contains defects and a second region outside the first region includes fewer defects than the first region.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with the present principles, structures, devices and methods for formation are provided to grow crystals of one material on a crystal of a different material (heteroepitaxy). Normally heteroepitaxial growth of a material on a crystal having a different lattice structure causes strain and defects in the grown material. In many instances, the strain and defects occur in multiple crystallographic directions. The present principles permit heteroepitaxial growth that results in a pristine crystal structure by cancelling pairing, trapping or terminating defects or defect lines or planes. The present principles can account for a multitude of crystallographic defect directions (e.g., 4 or more).

In one embodiment, a cavity is formed in a seed crystal that includes one or more surfaces and a restrictive neck portion. When a second material is epitaxially grown in the cavity, the shape of the cavity and the restrictive neck causes the defects to terminate on sidewalk, combine, be trapped or cancel. The present principles enhance aspect ratio trapping to further constrain defects by seed shape engineering. Multiple growth fronts facing each other permit the defects to interact and reduce defect propagation. The restrictive neck at an exit of the cavity or seed area further constrains the defects. The present embodiments can concurrently reduce or eliminate defects in four or more growth fronts.

In useful embodiments, a silicon substrate may be employed with a silicon oxide mask formed thereon. In other embodiments, any crystal material, e.g., (with and without buffer layers), InP, InAlAs, InGaAs, InAs, GaN etc. may be employed. In other embodiments, the substrate may include Ge. Other substrates may include any crystalline substrate for which heteroepitaxy is employed to grow a different material crystal. In particularly useful embodiments, non-crystalline materials may be employed to form the seed or cavity material. For example, polycrystalline semiconductors, e.g., III-V, Ge, nitrides, etc.; insulators, e.g., sapphire, quartz, etc.; metals, etc.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., GaInP, InGaAs or SiGe. These compounds include different proportions of the elements within the compound, e.g., InGaAs includes $In_x Ga_{1-x} As$, where x is less than or equal to 1, or SiGe includes $Si_x Ge_{1-x}$ where x is less than or equal to 1, etc. In addition, other elements may be included in the compound, such as, e.g., AlInGaAs, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
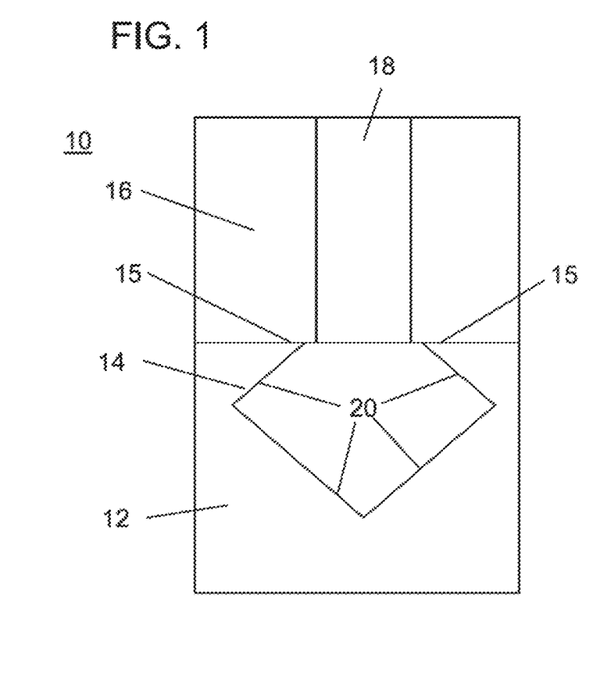
FIG. 1 is a cross-sectional view of a substrate with a mask layer formed thereon and including a seed shape engineered cavity etched into the substrate in accordance with the present principles.

Referring now to the drawings in which like numerals represent the same or similar elements and initially to FIG. 1, an illustrative structure 10 is shown to demonstrate the present principles. Structure 10 includes substrate 12. Substrate 12 may include a crystalline substrate material, e.g., Si, Ge, SiGe, SiC, III-V materials (with or without buffer layers), e.g., InP, InAlAs, InGaAs, InAs, GaN, AlGaAs, etc., or another other crystal material. A layer 16 is formed on or grown on the substrate 12. The layer 16 may include a material that is selective to crystal growth grown from a cavity 14 and through a trench 18. Selective to crystal growth means that a material grown through trench 18 does not nucleate and grow on layer 16 during heteroepitaxy, as will be described. The trench 18 includes a high aspect ratio. The high aspect ratio includes a depth to width ratio of 1.5 or greater.

In one embodiment, the layer 16 includes an oxide grown or deposited on the substrate 12. The layer 16 may be lithographically patterned or etched through a mask to etch the trench 18. The trench 18 may be etched using a reactive ion etch (RIE) process or other anisotropic etch process. The cavity 14 is then formed by an etch process, such as a wet etch process. The wet etch process may include a phosphoric acid etch, an ammonium hydroxide etch, a nitric acid etch, a hydrochloric acid etch, hydrofluoric acid, etc. The wet etch exposes crystallographic planes 20 within the substrate 12. The planes 20 may be sized and configured in accordance with a material to be grown within the cavity 14. The type of etch or combinations of etch processes (wet, dry, selectivities, etc.) may be designed to create a shape and dimensions of the shape of the cavity 14.

In addition, the use of the layer 16 permits the formation of a resistive neck region 15. The resistive neck region 15 provides a stopping point for defect lines and terminates propagation of defects.

Figure 2:
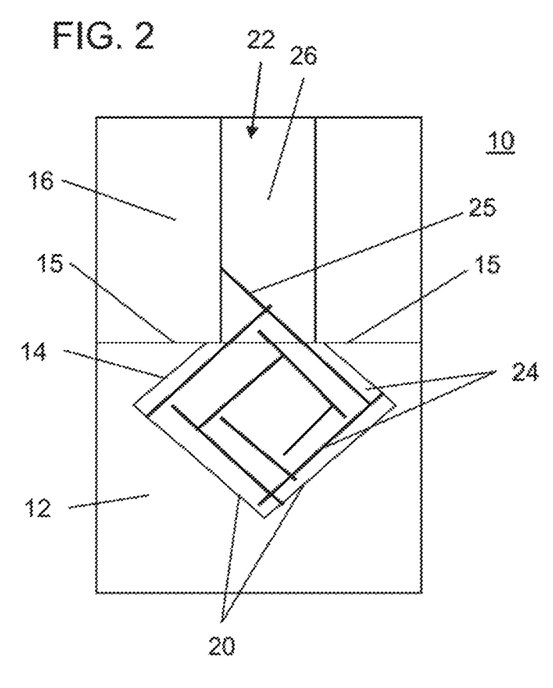
FIG. 2 is a cross-sectional view of the substrate of FIG. 1 showing the seed shape engineered cavity and the trench filled with a heteroepitaxially grown material with a reduced defect or defect free portion in accordance with the present principles.

Referring to FIG. 2, a crystal material 22 is heteroepitaxially grown on the substrate 12 within the cavity 14. The crystal material 22 may include a lattice mismatch or include other considerations or conditions that form defects 24. Defects 24 may grow or propagate through the material within the cavity 14 and terminate along the planes or sidewalls 20 or the cavity 14. By employing the four surfaces or planes 20 and the restrictive neck, the defects 24 in four directions are terminated against the surface 20. Even defects that propagate beyond the resistive neck portion 15 are terminated when they reach the layer 16 just outside the cavity 14. The defects 24, 25 are terminated before portion 26 of the crystal material 22. Therefore, the crystal material 22 in portion 26 is defect free (or defect reduced) and useful in many semiconductor devices and structures, field effect transistors, diodes, lasers, etc.

In useful embodiments, a buffer layer (not shown in FIG. 2) may be employed to line the cavity 14 on surfaces 20 to provide a better lattice match to reduce defect growth within material 22.

Material 22 is deposited on the crystalline substrate 12 within a high aspect ratio pattern in layer 16 and cavity 14 to provide aspect ratio trapping. The cavity 14 includes a seed area (substrate 12) with an engineered shape formed to address four or more different defect growth fronts for nucleation and heteroepitaxial growth. These growth fronts corresponding to planes or surfaces 20 preferably face each other. The restrictive neck 15 is formed at the exit of the shaped seed area or cavity 14. As material 22 nucleates and grows all the defects 24 and growth fronts meet and interact with each other. As defects 24 meet and interact during growth, the defects 24 can annihilate one another and twins and other planar types of defects can merge and terminate one of the twins and/or stacking faults to reduce defects for the material 22. The restrictive neck region 15 also filters out defects as the crystal growth emerges from the seed area or cavity 14, The remaining defects 25 continue and are trapped by the high aspect ratio structure (trench 18) formed by layer 16.

With more surfaces 20 to create defects 24 these surfaces 20 are shaped to promote the defects 24 meeting, and many of the defects 24 and much of the strain and other issues related to heteroepitaxy are trapped in the shaped seed region or cavity 14.

It should be understood that the heteroepitaxially grown structure may include a first region in or near the cavity and a second region outside the first region wherein the second region contains fewer defects than the first region. While the second region is preferably defect-free, it may still be advantageous to have the second region with fewer defects (i.e., significantly fewer defects than the first region). Devices may still be fabricated using the lower defect material of the second region.

Figure 3:
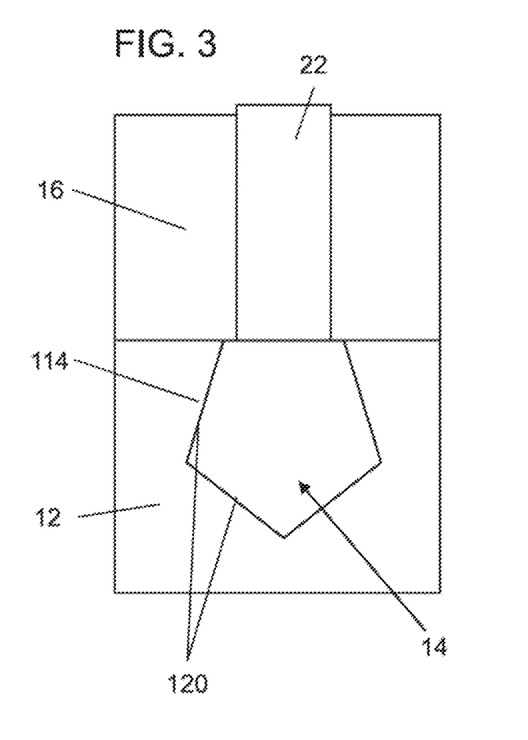
FIG. 3 is a cross-sectional view of a seed shape engineered cavity formed in a substrate in accordance with another embodiment.
Figure 4:
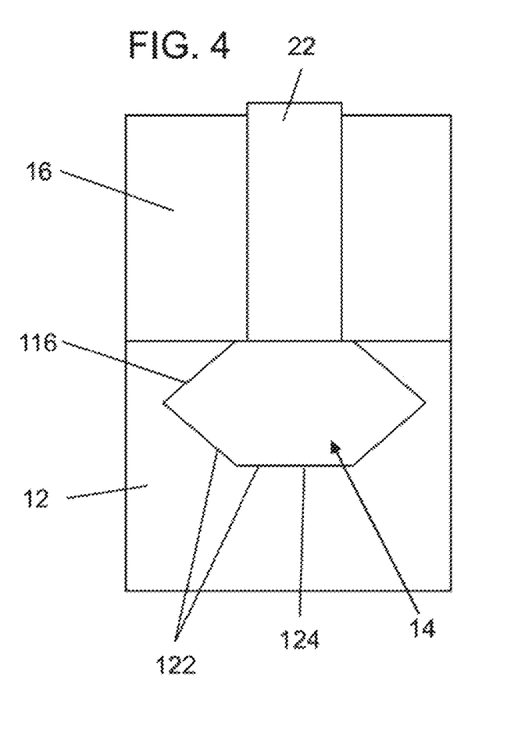
FIG. 4 is a cross-sectional view of a seed shape engineered cavity formed in a substrate with a flat parallel to a substrate surface in accordance with another embodiment.

Referring to FIGS. 3-6, a plurality of different shapes may be employed for cavity FIG. 3 shows a cavity 14 with a polygonal shape 114 having sides or surfaces 120. FIG. 4 shows a cavity 14 with a polygonal shape 116 having sides or, surfaces 122 including a surface 124 parallel to a top surface of the substrate 12.

Figure 5:
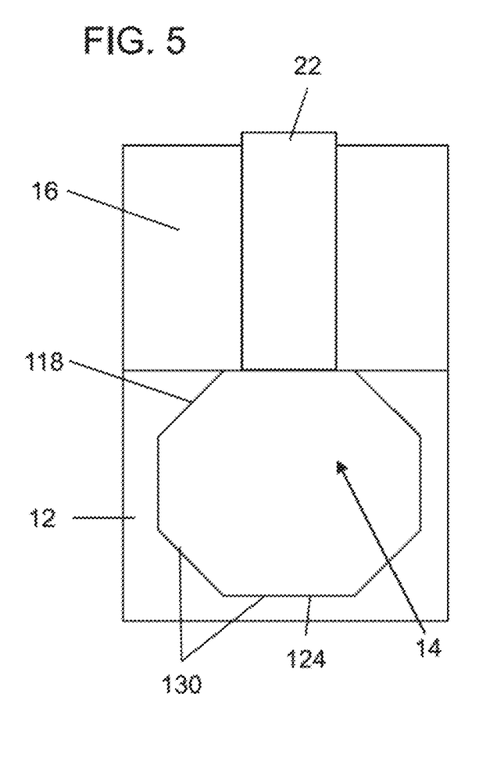
FIG. 5 is a cross-sectional view of a seed shape engineered cavity formed in a substrate with many surfaces and a flat parallel to a substrate surface in accordance with another embodiment.
Figure 6:
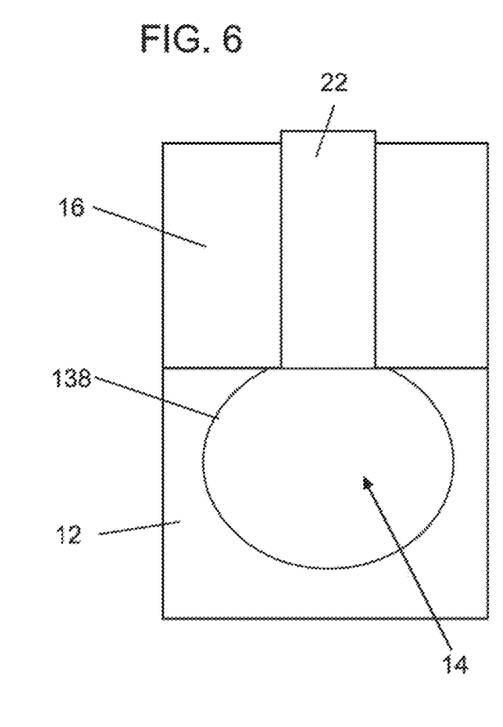
FIG. 6 is a cross-sectional view of a seed shape engineered cavity formed in a substrate with a continuous surface in accordance with another embodiment.

FIG. 5 shows a cavity 14 with a polygonal shape 118 having a greater number of sides or surfaces 130 including a surface 124 parallel to a top surface of the substrate 12. FIG. 6 shows a cavity 14 with a continuous shape 138. Other continuous shapes may also be employed, e.g., ovals, etc. Other shapes are also contemplated, diamond shapes, inverted triangles, etc. It should be understood that the present embodiments have been depicted as cross-sections of shapes. While the shapes may include two dimensional shapes, the shapes may also include surfaces in three dimensions (e.g., pyramidal, diamonds, polyhedral shapes, etc).

Figure 7:
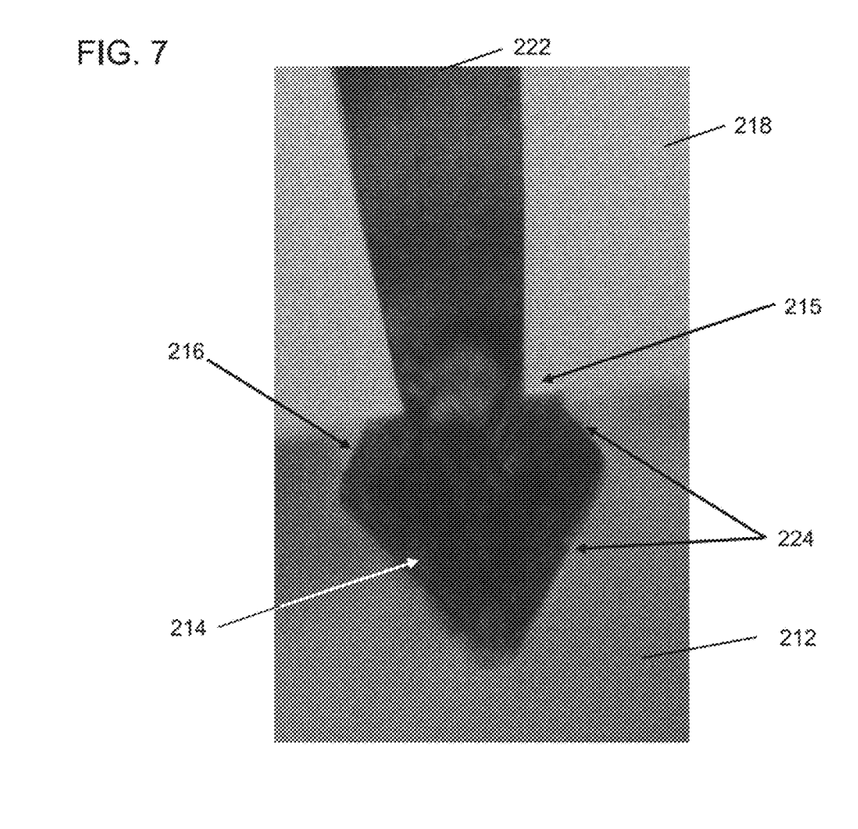
FIG. 7 is a cross-sectional view of a transmission electron microscope (TEM) image showing a seed shape engineered cavity and a trench filled with a heteroepitaxially grown material with a defect free portion in accordance with the present principles.

Referring to FIG. 7, a transmission electron microscope (TEM) image 200 depicts a structure formed in accordance with the present principles. A crystal material 222 is heteroepitaxially grown on a Si substrate 212 within a cavity 214. The crystal material 222 includes InP on a GaP buffer layer 224. A lattice mismatch between the InP of material 222 and the substrate 212 forms defects that are contained in a region just above a restrictive neck 215. The cavity 214 includes a diamond shape 216. Defects that may grow or propagate through the material within the cavity 214 are terminated along, the planes or sidewalls of the cavity 214. By employing the four surfaces or planes of the diamond shape 216 and the restrictive neck 215, the defects in four directions terminated against the surfaces. Even defects that propagate beyond the resistive leek portion 215 are terminated when they reach just outside the cavity 214. The buffer layer 224 is employed to line the cavity 214 on surfaces to provide a better lattice match to reduce defect growth within material 222. A silicon dioxide layer 218 is formed on the Si substrate 212.

Figure 8:
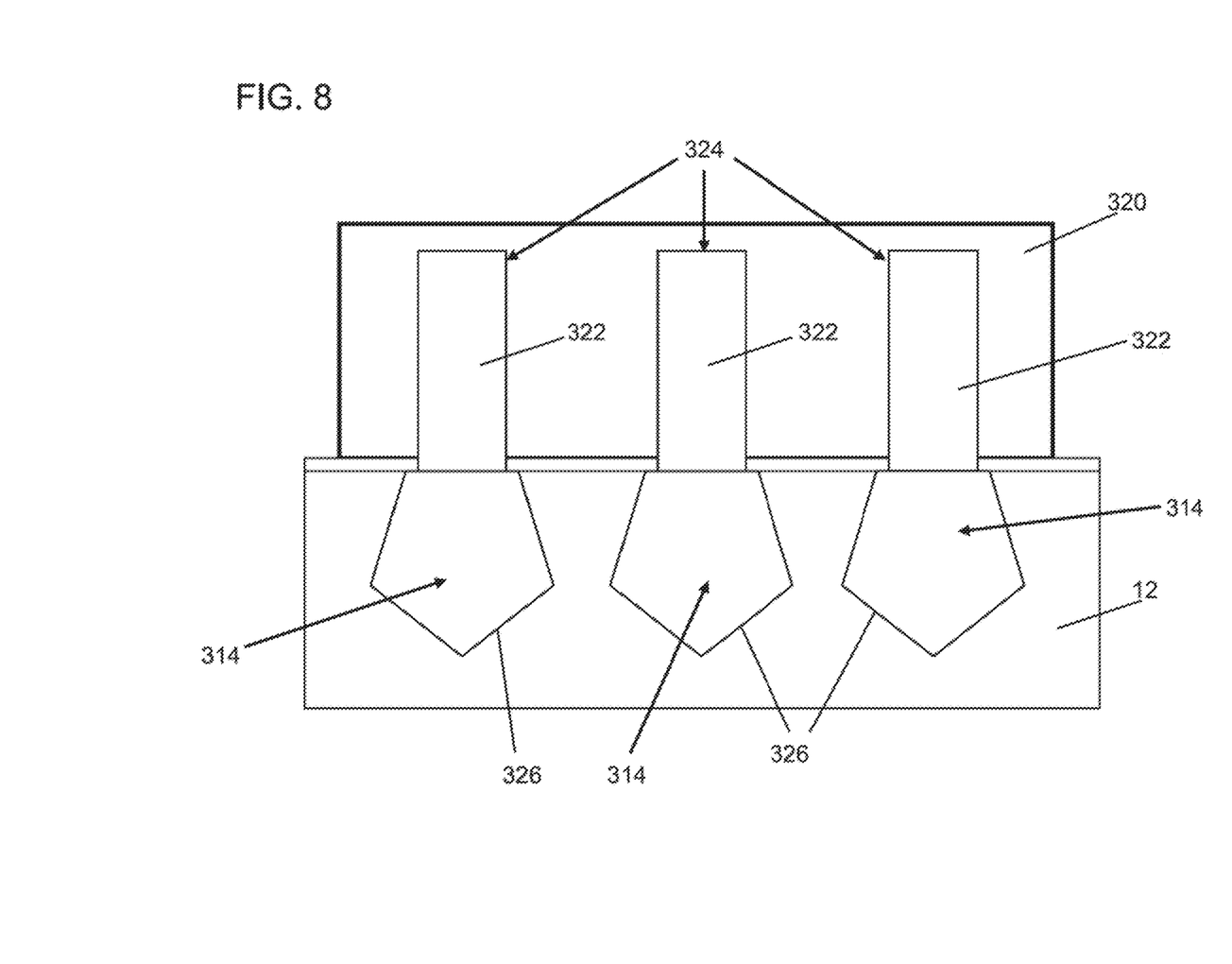
FIG. 8 is a cross-sectional view of an electronic device employing a heteroepitaxially grown material with a defect free portion in accordance with the present principles.

Referring to FIG. 8, heteroepitaxially grown crystalline material 322 may be employed in a number of applications, such as, e.g., its electronic devices. In one embodiment, the crystalline material 322 may be employed in fins 324 employed in fin field effect transistors (finFETs). A gate structure 320 is illustratively depicted over the fins 324 to form the transistors.

The crystalline material 322 may be employed for source or drain regions for vertical or planar transistors. The crystalline material 322 may be employed in a mesa for forming a diode or laser device. Other applications and devices are also contemplated.

FIG. 8 shows a seed shape engineered cavity 314 formed in a substrate 12 with a polygonal shape having sides or surfaces 326. The cavity 314 may include any useful shape.

Since defects are reduced or eliminated in the heteroepitaxially grown material, the seed substrate can include a wider array of materials. A crystalline semiconductor material may be grown from an insulator substrate, such as e.g., sapphire, quartz, etc. In addition, even metals may be employed for the seed substrate to grow crystalline semiconductor material.

Figure 9:
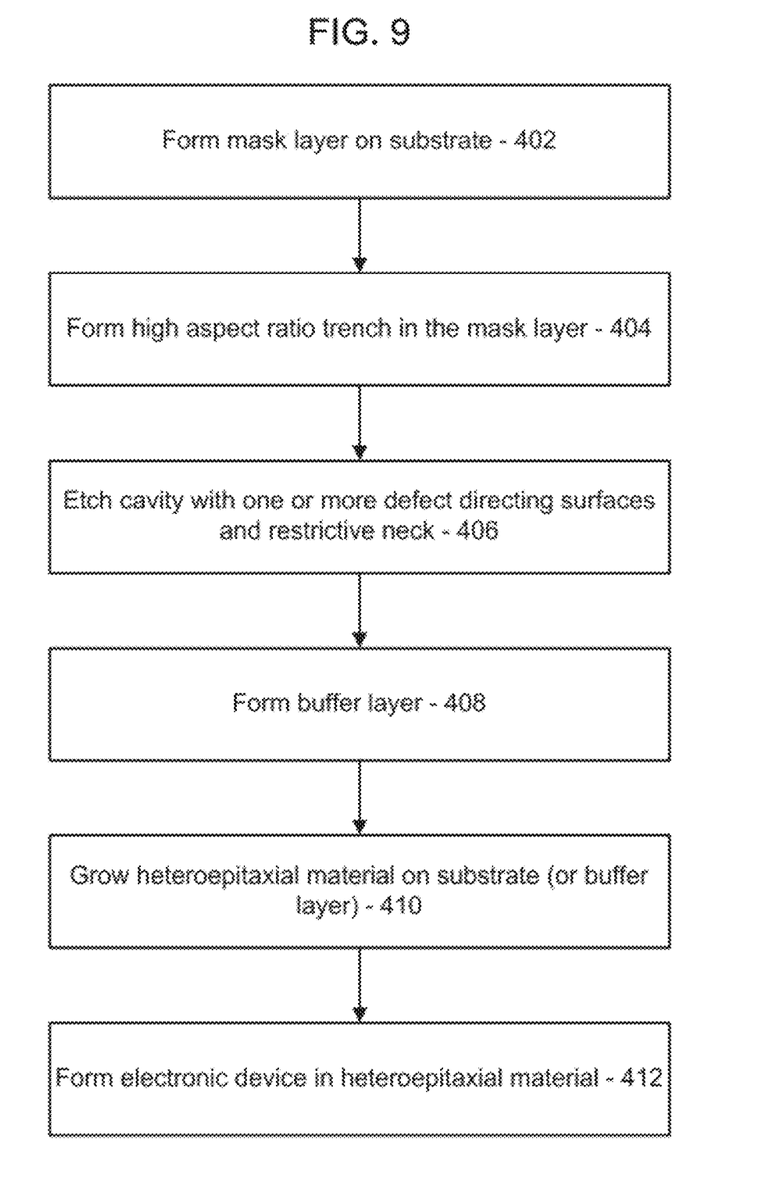
FIG. 9 is a block/flow diagram showing a method for heteroepitaxially growing a material in accordance with illustrative embodiments.

Referring to FIG. 9, a method for heteroepitaxially growing a material is shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block, diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 402, a mask layer is formed on a substrate. The mask layer may include a dielectric material, such as silicon dioxide, although other dielectric materials may be employed. The substrate may include a semiconductor crystal, a metal, an insulator or any other suitable materials. In block 404, a high aspect ratio trench is etched in the mask layer. This may include RIE.

In block 406, a cavity is etched into the substrate through the trench to form a shape with one or more surfaces to direct defects (defect directing surfaces) into one another on multiple growth fronts. Also, a resistive neck region is formed at an opening to the trench. The etch process ma include multiple etchings or a single etching that exposes crystal planes in the substrate materials. The etch process may include a wet etch, a dry etch, etc. or combinations thereof. The etching provides seed shape engineering to control defects in the heteroepitaxially grown crystal material to be formed. The one or more surfaces in the cavity may include a continuous surface (smooth surface such as a circle, u-shape, oval, etc. The one or more surfaces in the cavity preferably face each other to direct defects to interact with each other (e.g., to combine and cancel). The one or more surfaces constrain defects in four or more growth directions. The defects may be constrained in fewer growth directions as well.

In block 408, an optional buffer layer may be formed to line the one or more surfaces in the cavity. This may be employed for a number of reasons. One reason, for example, may include providing a better lattice match or transition between adjacent materials. Another reason may include, for example, providing a better deposition surface or adjusting a size of the cavity.

In block 410, a crystal material is heteroepitaxially grown on the substrate (or buffer layer, if present) where a first region in or near the amity contains defects, and a second region outside the first region is free of defects or has fewer defects that the first region. A determination of the height of the heteroepitaxially grown material can be computed to determine the height for which no defects (or fewer defects) can occur. This will depend on the shape of the cavity, the size of the resistive neck portion and the materials involved.

In block 412, the heteroepitaxially grown crystal material may be employed to form at least a portion of an electronic device, e.g., a transistor, diode, laser, etc. It should also be understood that the heteroepitaxially grown crystal material may serve as a seed substrate for a second heteroepitaxially grown crystal material and so on. In other embodiments, the heteroepitaxially grown materials may be formed in alternating patterns with different material being formed in a same substrate. Such patterns may be useful in forming different device types (e.g., NFETs and PFETs) in complementary metal oxide semiconductor (CMOS) devices.

Having described preferred embodiments for enhanced defect reduction for heteroepitaxy by seed shape engineering (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A heteroepitaxially grown structure, comprising:
a cavity formed in a substrate having a shape with one or more surfaces and including a resistive neck region at an opening to a trench;
a heteroepitaxially grown material formed on the substrate through the trench; and
the heteroepitaxially grown material including a first region in or near the cavity and a second region outside the first region.

2. The structure as recited in claim 1, wherein the second region is defect free.

3. The structure as recited in claim 1, wherein the one or more surfaces in the cavity face each other to direct defects to interact with each other.

4. The structure as recited in claim 1, further comprising a buffer layer lining the one or more surfaces in the cavity.

5. The structure as recited in claim 1, wherein the one or more surfaces in the cavity include a continuous surface.

6. The structure as recited in claim 1, wherein the one or more surfaces constrain defects in four or more growth directions.

7. The structure as recited in claim 1, wherein the heteroepitaxially grown material forms a portion of an electronic device.

8. The structure as recited in claim 1, wherein the substrate includes an insulator.

9. The structure as recited in claim 1, wherein the substrate includes a metal.

10. A heteroepitaxially grown structure, comprising:
a cavity formed in a crystalline semiconductor substrate having a shape with one or more surfaces and including a resistive neck region at an opening to a trench;
a heteroepitaxially grown material formed on the substrate, the heteroepitaxially grown material including a first region in or near the cavity and a second region outside the first region; and
an electronic device formed in the first region of the heteroepitaxially grown material.

11. The structure as recited in claim 10, wherein the one or more surfaces in the cavity face each other to direct defects to interact with each other.

12. The structure as recited in claim 10, further comprising a buffer layer lining the one or more surfaces in the cavity.

13. The structure as recited in claim 10, wherein the one or more surfaces in the cavity include a continuous surface.

14. The structure as recited in claim 10, wherein the one or more surfaces constrain defects in four or more growth directions.

15. A method for heteroepitaxially growing a material, comprising:
etching a high aspect ratio trench in a mask layer on a substrate;
etching a cavity in the substrate through the trench to form a shape with one or more surfaces and including a resistive neck region at an opening to the trench; and
heteroepitaxially growing a crystal material on the substrate where a first region in or near the cavity contains defects and a second region outside the first region.

16. The method as recited in claim 15, wherein the one or more surfaces in the cavity face each other to direct defects to interact with each other.

17. The method as recited in claim 15, further comprising forming a buffer layer to line the one or more surfaces in the cavity.

18. The method as recited in claim 15, wherein the one or more surfaces in the cavity include a continuous surface.

19. The method as recited in claim 15, wherein the one or more surfaces constrain defects in four or more growth directions.

20. The method as recited in claim 15, wherein heteroepitaxially growing the crystal material further includes forming a portion of an electronic device with heteroepitaxially grown material.

* * * * *